(12) United States Patent
Newcomb et al.

(10) Patent No.: US 7,519,892 B1
(45) Date of Patent: Apr. 14, 2009

(54) BINARY DATA ENCODING/DECODING WITH ERROR DETECTION, SUCH AS FOR COMMUNICATING BETWEEN COMPUTING PLATFORM COMPONENTS

(75) Inventors: Russell R. Newcomb, Morgan Hill, CA (US); William B. Simms, San Jose, CA (US); Barry A. Wagner, San Jose, CA (US)

(73) Assignee: nVidia Corporation, Santa Clara, CA (US)

( * ) Notice: Subject to any disclaimer, the term of this patent is extended or adjusted under 35 U.S.C. 154(b) by 487 days.

(21) Appl. No.: 11/251,405

(22) Filed: Oct. 14, 2005

(51) Int. Cl.
*H03M 13/00* (2006.01)
(52) U.S. Cl. .................... 714/758; 369/59.13
(58) Field of Classification Search .......... 341/55, 341/59; 375/216, 286; 711/103; 714/776, 714/758; 369/59.13
See application file for complete search history.

(56) References Cited

U.S. PATENT DOCUMENTS

| 4,677,421 A * | 6/1987 | Taniyama ............ 341/59 |
| 5,243,628 A * | 9/1993 | Moritoki et al. ....... 375/286 |
| 5,873,112 A * | 2/1999 | Norman ............. 711/103 |
| 6,556,628 B1 | 4/2003 | Poulton et al. |
| 6,696,990 B2 * | 2/2004 | Pascucci ............. 341/55 |
| 6,934,324 B2 * | 8/2005 | Yamazaki ........... 375/216 |
| 7,296,211 B2 * | 11/2007 | Cole et al. .......... 714/776 |

OTHER PUBLICATIONS

Senthinathan, R. and Prince, J.L.; Application Specific CMOS Output Driver Circuit Design Techniques to Reduce Simultaneous Switching Noise; Dec. 2003; 6 pages; IEEE Journal.
Sim, Jae-Yoom and Namgoong, Won; Multilevel Differential Encoding With Precentering for High-Speed Parallel Link Transceiver; Aug. 2005; 7 pages; vol. 40, No. 8, IEEE journal.
Non-Final Office Action for related U.S. Appl. No. 11/385,357 dated Sep. 5, 2008.
Notice of Allowance for related U.S. Appl. No. 11/752,088 dated Nov. 13, 2008.
Response to Non-Final Office Action for related U.S. Appl. No. 11/752,088 dated Oct. 6, 2008.
Response to Non-Final Office Action for related U.S. Appl. No. 11/385,357 dated Jan. 5, 2009.

* cited by examiner

*Primary Examiner*—David Ton
(74) *Attorney, Agent, or Firm*—Berkeley Law & Technology Group, LLP

(57) ABSTRACT

Embodiments for binary encoding and/or decoding data are disclosed. In or more embodiments, N data bits may be encoded using one of a plurality of codes derived from at least N+1 bits wherein each of the plurality of codes comprises approximately equal numbers of bits at a first logical level and a second logical level.

28 Claims, 6 Drawing Sheets

Encoding N data bits using one of a plurality of codes derived from at least N+1 bits wherein each of the plurality of codes comprises approximately equal numbers of bits at a first logical level and a second logical level. — 610

Transmit the encoded data — 620

BINARY DATA ENCODING/DECODING WITH ERROR DETECTION, SUCH AS FOR COMMUNICATING BETWEEN COMPUTING PLATFORM COMPONENTS

BACKGROUND

This disclosure is related to data encoding and/or decoding.

As interfaces between components in computing platforms and/or between units within integrated circuits increase in transmission speed and/or bus width, noise and signal integrity issues increase in importance. For parallel data busses, for example data busses coupling memory devices to memory controllers, power supply variations and power supply noise may become issues due to relatively large changes in the ratio of '0' bits to '1' bits on the bus in consecutive cycles. Also, as transmission speeds and/or bus widths increase, error detection and/or correction may become increasingly important.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
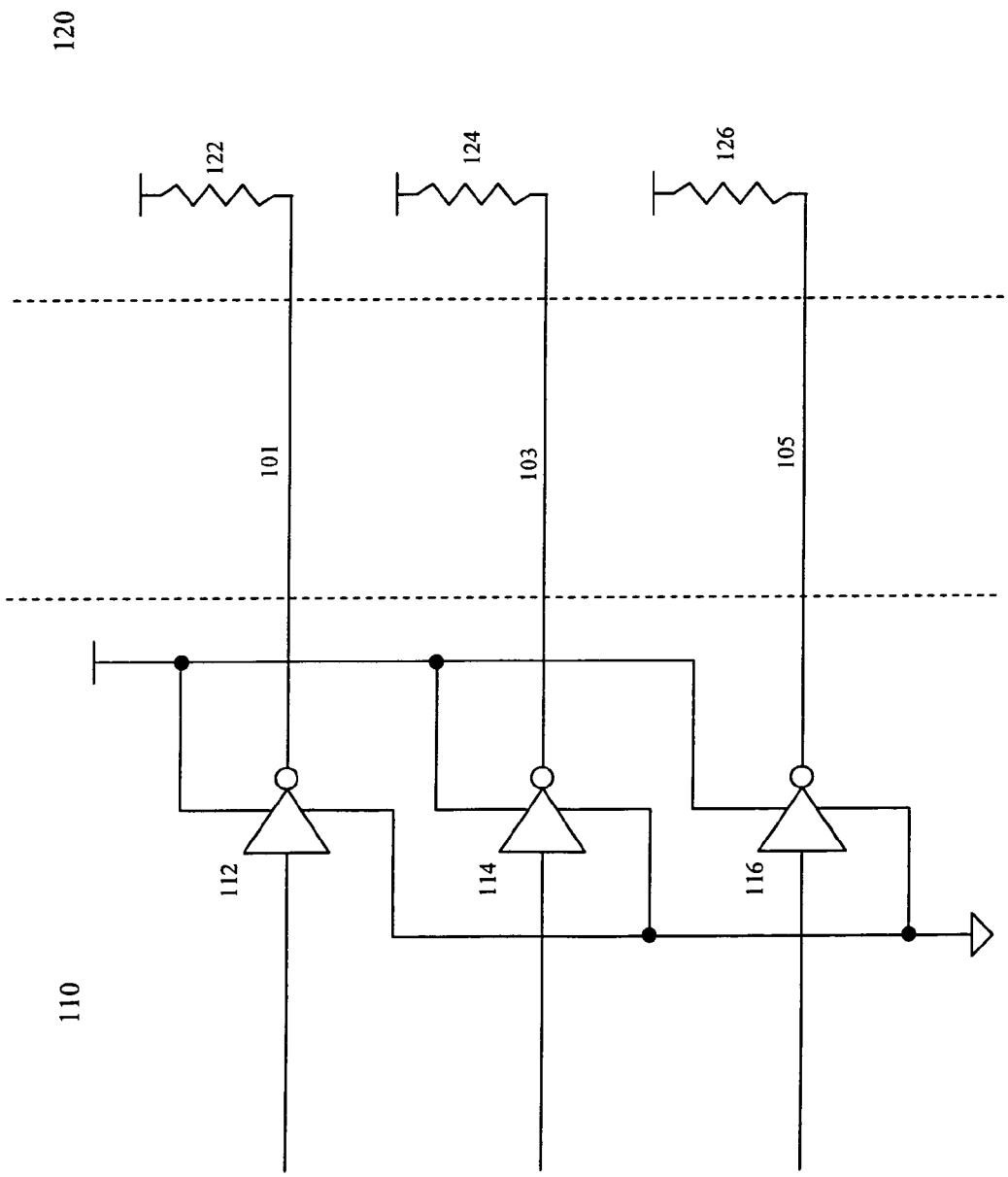
FIG. 1 is a schematic diagram including a plurality of output buffers each coupled to a power source.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

As pointed out above, for parallel data busses, power supply variations and power supply noise may become issues due to relatively large changes in the ratio of '0' bits to '1' bits on the bus in consecutive cycles. A need, therefore, exists for techniques that may reduce power supply variations and/or power supply noise.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

FIG. 1 is a schematic diagram of a transmitting device 110 coupled to a receiving device 120. For this example, the transmitting device 110 includes output buffers 112, 114, and 116 which may each be connected to a power supply and ground. Also for this example, receiving device 120 includes pull-up resistors 122, 124, and 126 that may provide termination for data lines 101, 103, and 105. Although this example depicts only three data lines coupling transmitting device 110 and receiving device 120, other examples may include many more data lines and associated buffers.

As can be seen in FIG. 1, data lines 101, 103, and 105 may be driven or pulled-up to one of two states, either a logically high voltage level state or a logically low voltage level state. The use of two states to communicate information over a data line may be referred to as binary signaling. Other embodiments may include other states, for example a tri-state where the data lines are left floating. For this example embodiment, when a buffer is turned on, an associated data line is driven to a logically low voltage level. When the buffer is turned off, the associated data line is pulled to a logically high voltage level by a pull-up resistor at the receiving device. Although transmitting device 110 includes buffers that are capable of driving data lines to a logically low voltage level, other embodiments are possible. For example, other embodiments may include buffers that are capable of driving data lines to either a logically low voltage level or a logically high voltage level. Further, although receiving device 120 is depicted with pull-up resistors, a wide range of other configurations are possible, including, but not limited to, the use of resistors coupled to ground.

As previously mentioned, when relatively large numbers of buffers of a parallel interface are turned on and/or change states at approximately the same time, extra demands may be made on a power supply resulting in supply voltage variations and/or noise. These supply voltage variations and/or noise may adversely effect signal integrity on data lines, thereby limiting the potential performance of the interface.

Figure 2:
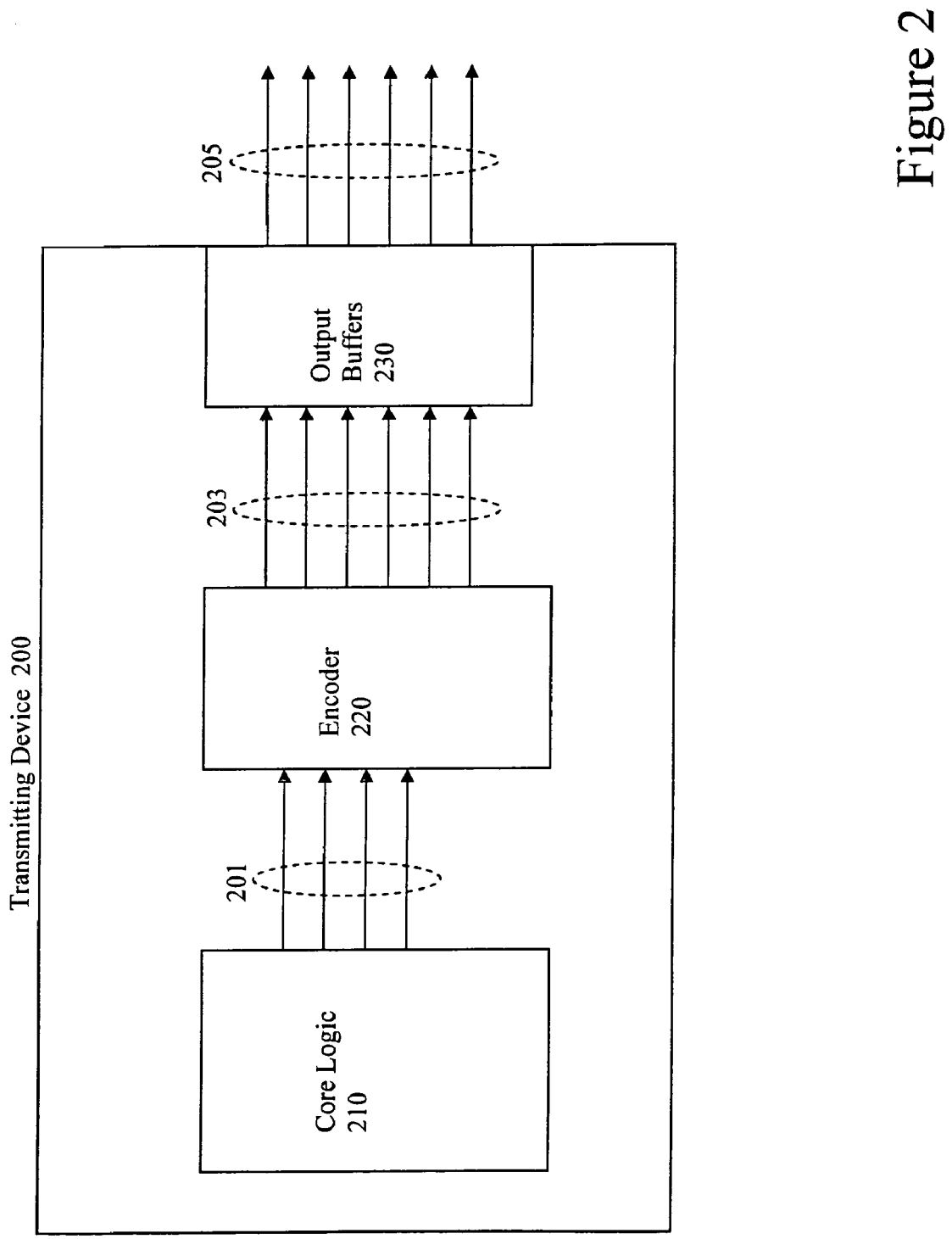
FIG. 2 is a block diagram of one embodiment of an example transmitting device.

In order to help avoid the potentially adverse effects of power supply variation and/or power supply noise, some embodiments may encode a number of data bits using codes that have approximately equal numbers of bits at each logical state. For example, FIG. 2 is a block diagram of one embodiment of an example transmitting device 200. Transmitting device 200 may include a core logic 210. For this example embodiment, core logic 210 may generate data delivered to an encoder 220 via four data lines 201. Encoder 220 may receive the data delivered via data lines 210 and may encode the received data using one of a number of codes. For this example embodiment, the codes may be derived from six bits. Thus, for this example, four data bits are encoded using six bit codes. For this example embodiment, each code includes three bits at a logically low level and three bits at a logically high level. Below is a table of codes for this example embodiment:

| Desired 4 bit data | Output 6 bit code |
|---|---|
| 0000 | 000111 |
| 0001 | 001011 |
| 0010 | 001101 |
| 0011 | 001110 |
| 0100 | 010011 |
| 0101 | 010101 |
| 0110 | 010110 |
| 0111 | 011001 |
| 1000 | 011010 |
| 1001 | 011100 |
| 1010 | 100011 |
| 1011 | 100101 |
| 1100 | 100110 |
| 1101 | 101001 |
| 1110 | 101010 |
| 1111 | 101100 |
| Special char 1 | 110001 |
| Special char 2 | 110010 |
| Special char 3 | 110100 |
| Special char 4 | 111000 |

As can be seen in the table of codes above, each of the six bit codes comprises three bits with a value of '0' and three bits with a value of '1'. Also, because the number of available six bit codes is greater than the number of four bit data combinations, several special characters may be implemented for any of a wide range of purposes. Although this example embodiment uses six bit codes to encode four bits of data, the claimed subject matter is not limited in this respect. Other embodiments are possible using any of a wide range of data bits and encoded data widths. For one example embodiment, ten bits may be used to encode eight data bits. Further, although this example embodiment uses equal numbers of '0' and '1' bits in each code, other embodiments are possible using unequal numbers of '0' and '1' bits.

Encoder 220 for this example embodiment may deliver encoded data via encoded data lines 203 to output buffers 230. Buffers 230 may in turn output six bit codes over a parallel data bus 205 which for this example comprises six data lines, although the claimed subject matter is not limited in this respect.

Parallel data bus 205 may be coupled to a receiving device such as device 300 discussed below in connection with FIG. 3. Because for this example embodiment each six bit code comprises equal numbers of '0' and '1' bits, for every data cycle the same number of buffers are turned on, thereby avoiding situation where relatively large changes in the ratio of '0' bits to '1' bits occur on the bus. Although for this example embodiment equal numbers of '0' and '1' bits are utilized for encoding, other embodiments are possible using unequal numbers of '0' and '1' bits.

As used herein, the term "approximately equal numbers of bits" is meant to include any ratio of bits at a first logical level and at a second logical level that avoids the situation where significantly more than half of the output buffers for a parallel interface are driving data lines to a first logical voltage level at one point in time then at a subsequent point in time significantly less than half of the output buffers for the parallel interface are driving data lines to the first logical voltage level.

In additional to helping reduce power supply variations and/or power supply noise, the example embodiments described herein, as well as other possible embodiments, may aid in the reduction of Electromagnetic Interference (EMI). Further, embodiments are possible where codes are selected in order to help reduce Simultaneous Switching Output (SSO) noise, which noise may occur when relatively large numbers of output buffers switch from one state to another concurrently.

Further, for some embodiments, error detection may be implemented. For example, in the six bit codes described above, there are equal numbers of bits at '0' and '1', and any time unequal numbers of '0' and '1' bits are detected at the receiving device, a single bit error may be indicated, although the claimed subject matter is not limited in these respects. In embodiments with unequal numbers of '0' and '1' bits, other error detection techniques may be used. For example, codes may be selected that always use an even number of '1' bits, and any time an odd number of '1' bits is detected at the receiving device, an error may be indicated, although again the claimed subject matter is not limited in these respects. In other embodiments, special characters, such as those described above, may be utilized to implement any of a wide range of error detection and/or correction methods.

Figure 3:
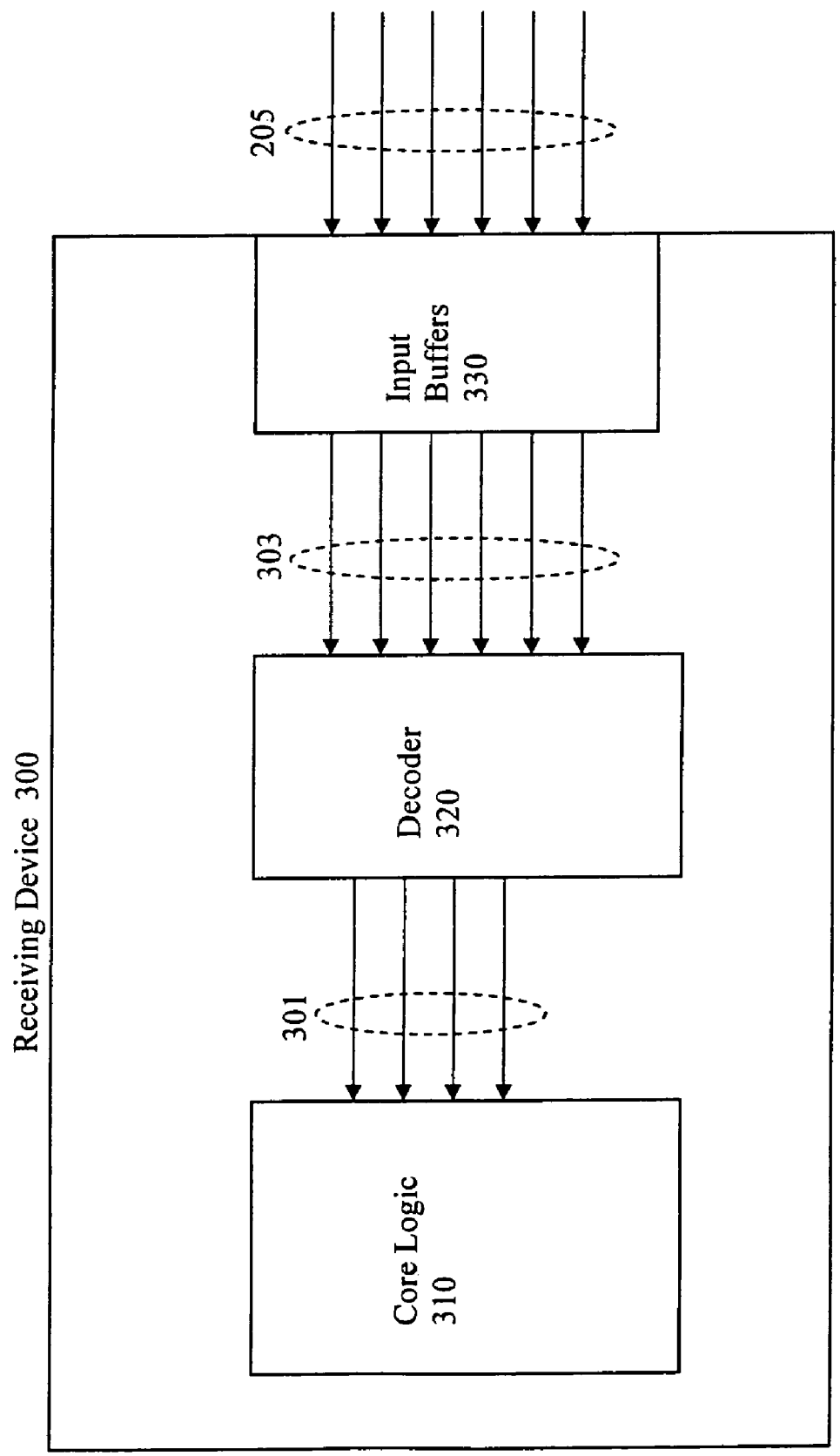
FIG. 3 is a block diagram of one embodiment of an example receiving device.

FIG. 3 is a block diagram of one embodiment of an example receiving device 300. For this example, receiving device 300 receives encoded data via parallel data bus 205. The encoded data bits may be received at input buffers 330 and passed on to a decoder unit 320 via encoded data lines 303. For this example, decoder 320 may decode the received six bit encoded data to produce four bits of data which may be delivered to a core logic 310 via data lines 301. Although this example embodiment decodes six bit codes to produce four decoded data bits, the claimed subject matter is not limited in this respect and other embodiments are possible using any of a wide range of data bits and encoded data widths.

The example embodiment above describes a transmitting device coupled to a receiving device via a parallel data bus. The transmitting and receiving devices may comprise any of a wide range of devices and/or components, including, but not limited to, central processing units (CPU), graphics processing units (GPU), memory devices, etc. For example, the transmitting device may comprise a graphics processing unit (GPU) and the receiving device may comprise a memory device. For another example, the transmitting device may comprise a memory device and the receiving device may comprise a GPU.

Figure 4:
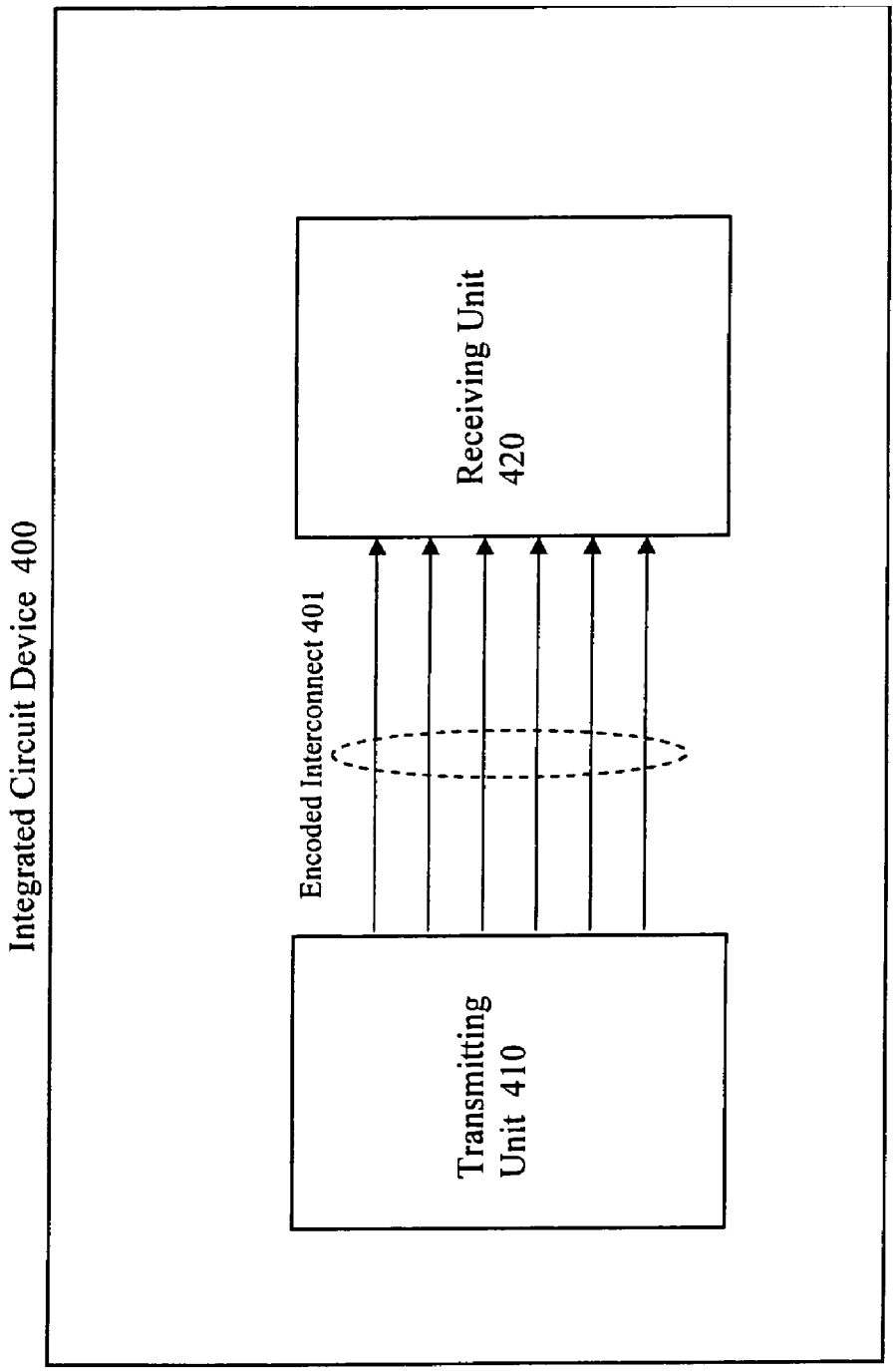
FIG. 4 is a block diagram of an example integrated circuit device comprising example embodiments of a transmitting unit and a receiving unit.

In addition to embodiments where the transmitting device and the receiving device comprise separate devices and/or components, other embodiments are possible where the example encoding techniques described herein are used to communicate data between units within a single integrated circuit device. For example, FIG. 4 is a block diagram of an example integrated circuit device 400 comprising example embodiments of a transmitting unit 410 and a receiving unit 420. Integrated circuit device 400 may comprise any of a wide range of devices and/or components, including, but not limited to, central processing units, graphics processing units, memory devices, etc. Transmitting unit 410 and receiving unit 420 for this example embodiment are coupled together via and encoded interconnect 401. Transmitting unit 410 may deliver encoded data to receiving unit 420 via the encoded interconnect 401. The encoding and decoding techniques used by transmitting unit 410 and receiving unit 420 may include any of the example techniques described herein. Further, other embodiments are possible where the transmitting unit resides on one integrated circuit die and the receiving unit 420 resides on a second integrated circuit die and the first die and the second die share a common package.

Figure 5:
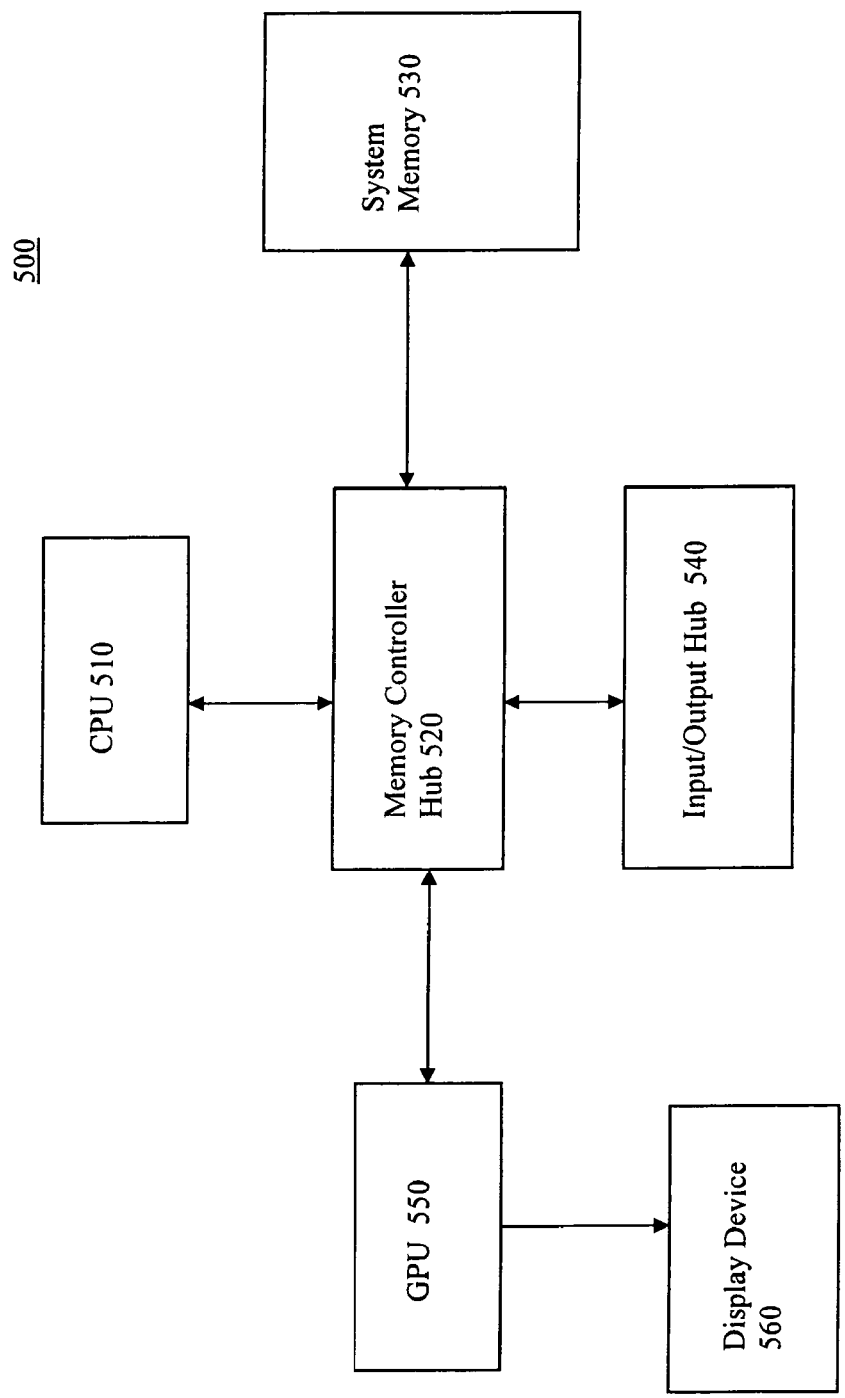
FIG. 5 is a block diagram of an example embodiment of a computing platform.

FIG. 5 is a block diagram of an example embodiment of a computing platform 500. Computing platform 500 includes a CPU 510 and a memory controller hub 520 coupled to CPU 510. Memory controller hub 520 is further coupled to a system memory 530, to a GPU 550, and to an input/output hub 540. GPU 550 is further coupled to a display device 560, which may comprise a CRT display, a flat panel LCD display, or other type of display device.

GPU 550 may comprise an integrated circuit device similar to that discussed above in connection with FIG. 4, where the device includes transmitting and receiving units to encode and decode data in accordance to any of the example encoding and decoding embodiments described herein. Further, the example encoding and decoding embodiments described herein may be utilized to transfer data between any of the components of computing platform 500. That is, any of the components of computing platform 500 may comprise transmitting devices and/or receiving devices configured in accordance with the example transmitting and receiving device embodiments described herein.

Although example system 500 is shown with a particular configuration of components, other embodiments are possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

Although the example embodiments described herein use parallel bus widths of either six or ten data lines, the claimed subject matter is not limited in this respect. Other embodiments are possible using any of a wide range of parallel bus widths. In some embodiments, wider busses may be implemented by combining two or more narrower bus lanes. For one example, thirty-two data bits may be encoded using four sets of codes where each code is ten bits wide, and the encoded data may be delivered from a transmitting device to a receiving device via forty data lines. For this example embodiment, codes may be utilized that ensure that no more than twenty four and at least sixteen data lines are driven to a first logical voltage level at a given time, although the claimed subject matter is not limited in this respect.

Figure 6:
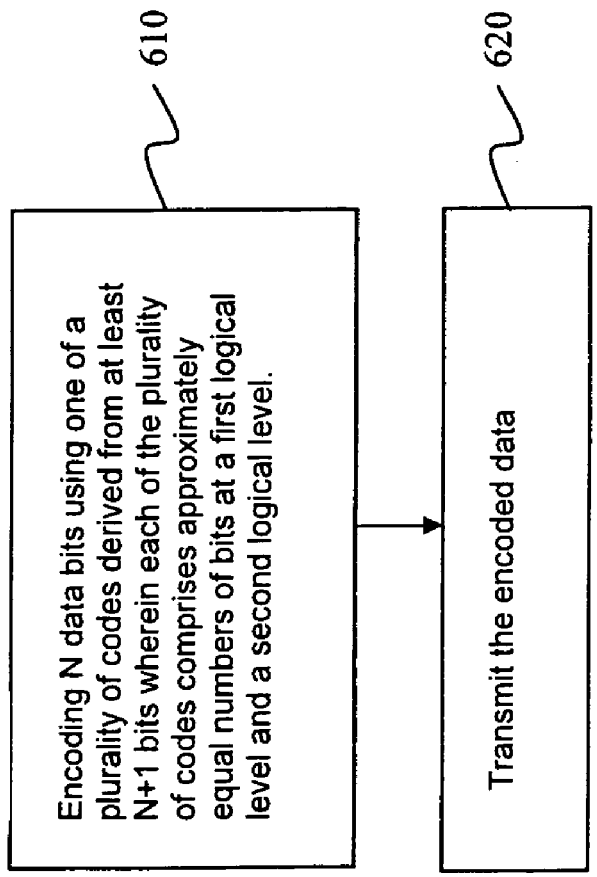
FIG. 6 is a flow diagram of an example embodiment of a method for encoding data.

FIG. 6 is a flow diagram of an example embodiment of a method for encoding data. At block 610, N data bits are encoded using one of a number of codes derived from at least N+1 bits. For this example embodiment, eight bits may be encoded using one of a number of codes derived from ten bits. Also for this example embodiment, each of the plurality of codes comprises approximately equal numbers of bits of a first logical level and of a second logical level. For this example, the first logical level may comprise a logical value of '0' and the second logical level may comprise a logical level of '1', although the claimed subject matter is not limited in this respect. At block 620, the encoded data is transmitted.

In another example embodiment, N data bits may be encoded using one of a plurality of codes derived from at least N+1 bits wherein the plurality of codes derived from the at least N+1 bits each comprise no more than M bits at a first logical level and at least M−2 bits at a second logical level. For one embodiment, encoding N bits may comprise encoding eight data bits using one of a plurality of codes derived from ten bits. For one embodiment, the ten bits may comprise no more than six bits at the first logical level and at least four bits at the second logical level.

Further, for another example embodiment, one of a plurality of codes derived from at least N+1 bits may be decoded to produce N decoded data bits. For this example embodiment, the plurality of codes derived from the at least N+1 bits may comprise no more than M bits at a first logical level and at least M−2 bits at a second logical level. For one embodiment, decoding a code derived from at least N+1 bits may comprise decoding one of a plurality of codes derived from ten bits to produce eight decoded bits. Also for this example embodiment, each of the plurality of codes derived from ten bits may comprise no more than six bits at the first logical level and at least four bits at the second logical level.

For one example embodiment, although the claimed subject matter is not limited in these respects, a method for selecting codes may be described as follows. A number of bits may be selected for a final encoded width W to replace a K width bus. The number of codes (if W is an even number) that have W/2 at logical level '1' and W/2 at logical level '0' may be determined. If there are fewer than $2^K$ codes, the search may be expanded to include (W/2)−1 codes at logical level '1' and (W/2)−1 codes at logical level '0'. Codes with (W/2)−1 codes at logical level '0' and (W/2)+1 codes at logical level '1' may also be included. If the number W is an odd number, codes that have (W−1)/2 at a logical level '1' and (W+1)/2 at a logical level '0' may be selected. Codes with (W−1)/2 at a logical level '0' and (W+1)/2 at a logical level '1' may also be included. If appropriate, additional output codes that are not as balanced may be selected.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method, comprising:
encoding N data bits using one of a plurality of codes derived from at least N+1 bits wherein the plurality of codes derived from the at least N+1 bits comprise no more than M bits at a first logical level and at least M−2 bits at a second logical level, and wherein one or more of the plurality of codes derived from at least N+1 bits comprise a specified even or odd number of bits at a specified one of the first and second logical levels such that a receipt at a receiving device of one or more codes not comprising said specified even or odd number of bits at the specified one of the first and second logical levels indicates an error condition.

2. The method of claim 1, wherein said encoding said N data bits includes encoding eight data bits using one of a plurality of codes derived from ten bits wherein the ten bits comprise no more than six bits at the first logical level and at least four bits at the second logical level.

3. The method of claim 1, further comprising transmitting the one of the plurality of codes from a transmitting device to a receiving device.

4. The method of claim 1, further comprising outputting the one of the plurality of codes from a transmitting unit of an integrated circuit to a receiving unit of the integrated circuit.

5. The method of claim 1, wherein the plurality of codes derived from at least N+1 bits comprise at least in part special characters configured for error detection and/or correction.

6. A method, comprising:
decoding one of a plurality of codes derived from at least N+1 bits to produce N decoded data bits, wherein the plurality of codes derived from the at least N+1 bits comprise no more than M bits at a first logical level and at least M−2 bits at a second logical level, and wherein one or more of the plurality of codes derived from at least N+1 bits comprise a specified even or odd number of bits at a specified one of the first and second logical levels such that a receipt at a receiving device of one or more codes not comprising said specified even or odd number of bits at the specified one of the first and second logical levels indicates an error condition.

7. The method of claim 6, wherein said decoding said one of a plurality of codes includes decoding one of a plurality of codes derived from ten bits to produce eight decoded data bits wherein the plurality of codes derived from ten bits each comprise no more than six bits at the first logical level and at least four bits at the second logical level.

8. The method of claim 6, further comprising detecting an error in the one of the plurality of codes by determining whether the one of the plurality of codes does not comprise said specified even or odd number of bits at the specified one of the first and second logic levels.

9. The method of claim 8, wherein said detecting said error in the one of the plurality of codes comprises detecting a single bit error.

10. A method, comprising:
encoding N data bits using one of a plurality of codes derived from at least N+1 bits wherein the plurality of codes comprises approximately equal numbers of bits at a first logical level and a second logical level, and wherein one or more of the plurality of codes derived from at least N+1 bits comprise an even number of bits at a specified one of the first and second logical levels such that a receipt at a receiving device of one or more codes comprising an odd number of bits at the specified one of the first and second logical levels indicates an error condition.

11. The method of claim 10, further comprising transmitting the one of the plurality of codes to a receiving device.

12. The method of claim 10, further comprising delivering the one of the plurality of codes from a transmitting unit of an integrated circuit to a receiving unit of the integrated circuit.

13. The method of claim 10, wherein said encoding N data bits comprises encoding 8 data bits using one of a plurality of codes derived from ten bits wherein each of the plurality of codes comprises no more than six bits of a first logical level and at least four bits of a second logical level.

14. An apparatus, comprising:
an encoding unit to encode N data bits using one of a plurality of codes derived from at least N+1 bits wherein the plurality of codes comprises no more than M bits at a first logical level and at least M−2 bits at a second logical level, and wherein one or more of the plurality of codes derived from at least N+1 bits comprise a specified even or odd number of bits at a specified one of the first and second logical levels such that a receipt at a receiving device of one or more codes not comprising said specified even or odd number of bits at the specified one of the first and second logical levels indicates an error condition.

15. The apparatus of claim 14, further comprising:
a plurality of output buffers to transmit the one of the plurality of codes.

16. The apparatus of claim 15, wherein the plurality of output buffers are coupled to a receiving device.

17. The apparatus of claim 16, where the receiving device comprises a memory device.

18. The apparatus of claim 15, wherein the apparatus comprises a graphics processing unit.

19. The apparatus of claim 15, wherein the apparatus comprises a memory device.

20. The apparatus of claim 14, wherein said encoding said N data bits includes encoding eight data bits using one of a plurality of codes derived from ten bits wherein the ten bits comprise no more than six bits at the first logical level and at least four bits at the second logical level.

21. An apparatus, comprising:
an encoding unit to encode N data bits using one of a plurality of codes derived from at least N+1 bits wherein each of the plurality of codes comprises approximately equal numbers of bits at a first logical level and a second logical level, and wherein one or more of the plurality of codes derived from at least N+1 bits comprise a specified even or odd number of bits at a specified one of the first and second logical levels such that a receipt at a receiving device of one or more codes not comprising said specified even or odd number of bits at the specified one of the first and second logical levels indicates an error condition.

22. The apparatus of claim 21, further comprising:
a plurality of output buffers to transmit the one of the plurality of codes to a receiving device.

23. The apparatus of claim 22, wherein the receiving device comprises a memory device.

24. The apparatus of claim 21, wherein the apparatus comprises a graphics processing unit.

25. The apparatus of claim 21, wherein the apparatus comprises a memory device.

26. An article, comprising: a storage medium having stored thereon instructions that, if executed, enable a computing platform to:
encode N data bits using one of a plurality of codes derived from at least N+1 bits wherein the plurality of codes derived from the at least N+1 bits comprise no more than M bits at a first logical level and at least M−2 bits at a second logical level, and wherein one or more of the plurality of codes derived from at least N+1 bits comprise a specified even or odd number of bits at a specified one of the first and second logical levels such that a receipt at a receiving device of one or more codes not comprising said specified even or odd number of bits at the specified one of the first and second logical levels indicates an error condition.

27. The article of claim 26, wherein the storage medium has stored thereon further instructions that, if executed, further enable the computing platform to encode the N data bits by encoding eight data bits using one of a plurality of codes derived from ten bits wherein the ten bits comprise no more than six bits at the first logical level and at least four bits at the second logical level.

28. The article of claim 26, wherein the storage medium has stored thereon further instructions that, if executed, further enable the computing platform to detect an error in the one of the plurality of codes by determining whether the one of the plurality of codes does not comprise said specified even or odd number of bits at the specified one of the first and second logic levels.

* * * * *